(12) United States Patent
Villa et al.

(10) Patent No.: US 7,071,073 B2
(45) Date of Patent: Jul. 4, 2006

(54) PROCESS FOR MANUFACTURING LOW-COST AND HIGH-QUALITY SOI SUBSTRATES

(75) Inventors: Flavio Villa, Milan (IT); Gabriele Barlocchi, Cornaredo (IT); Pietro Corona, Rome (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 276 days.

(21) Appl. No.: 10/331,189

(22) Filed: Dec. 26, 2002

(65) Prior Publication Data

US 2003/0148588 A1 Aug. 7, 2003

(30) Foreign Application Priority Data

Dec. 28, 2001 (EP) .............................. 01830822

(51) Int. Cl.
*H01L 21/76* (2006.01)

(52) U.S. Cl. ...................... 438/426; 438/431
(58) Field of Classification Search .............. 438/42, 438/353, 370, 409, 426, 431, 526, 960
See application file for complete search history.

(56) References Cited

U.S. PATENT DOCUMENTS

| 5,804,491 | A | | 9/1998 | Ahn |
| 6,506,658 | B1 | * | 1/2003 | D'Arrigo et al. ............ 438/359 |
| 6,518,147 | B1 | | 2/2003 | Villa et al. |
| 6,551,937 | B1 | * | 4/2003 | Jun et al. .................... 438/694 |

FOREIGN PATENT DOCUMENTS

| EP | 0 929 095 A1 | | 7/1999 |
| EP | 0 996 145 A2 | | 4/2000 |
| EP | 1 043 770 A1 | | 10/2000 |
| EP | 1 073 112 A1 | | 1/2001 |
| IT | EP 1 043 770 A1 | * | 10/2000 |
| IT | EP 1 067 599 A1 | * | 1/2001 |
| IT | EP 1 073 112 A1 | * | 1/2001 |
| JP | 60074452 | | 4/1985 |

OTHER PUBLICATIONS

Tsunashima, et al., "A New Substrate Engineering Technique to Realize Silicon on Nothing (SON) Structure Utilizing Transformation of Sub–micron Trenches to Empty Space in Silicon (ESS) by Surface Migration", High Purity Silicon VI. Proceedings of the Sixth International Symposium (Electrochemical Society Proceedings vol. 2000–17)(SPIE vol. 4218)Phoenix, AZ, USA, Oct. 22–27, 2000, pp. 532–545.

(Continued)

*Primary Examiner*—David Nelms
*Assistant Examiner*—David Vu
(74) *Attorney, Agent, or Firm*—Lisa K. Jorgenson; Bryan A. Santarelli; Graybeal Jackson Haley LLP

(57) ABSTRACT

For manufacturing an SOI substrate, the following steps are carried out: providing a wafer of semiconductor material; forming, inside the wafer, a plurality of passages forming a labyrinthine cavity and laterally delimiting a plurality of pillars of semiconductor material; and oxidizing the pillars of semiconductor material to form a buried insulating layer. For forming the labyrinthine cavity, a trench is first formed in a substrate; an epitaxial layer is grown, which closes the trench at the top; the wafer is annealed so as to deform the pillars and cause them to assume a minimum-energy handlebar-like shape, and a peripheral portion of the wafer is removed to reach the labyrinthine cavity, and side inlet openings are formed in the labyrinthine cavity. Oxidation is performed by feeding an oxidizing fluid through the side inlet openings.

35 Claims, 5 Drawing Sheets

OTHER PUBLICATIONS

Sato, et al., "Micro-structure Transformation of Silicon: A Newly Developed Transformation Technology for Patterning Silicon Surfaces Using the Surface Migration of Silicon Atoms by Hydrogen Annealing" Japanese Journal of Applied Physics, Publication Office Japanese Journal of Applied Physics, Tokyo, Japan, vol. 39, No. 9A, Part 1, Sep., 2000, pp. 5033–5038.

Sato, et al., "A New Substrate Engineering for the Formation of Empty Space in Silicon (ESS) Induced by Silicon Surface Migration", IEEE 1999, 0–7803–5410–9/99, pp. 517–520.

European Search Report for 01830820.5, Jun. 20, 2002.

European Search Report for 01830822.1–1524; Sep. 17, 2002.

Hausman, et al. Silicon–on–Insulator Wafer Bonding–Wafer Thinning Technological Evaluations, Japanese Journal of Applied Physics, vol. 28, No. 8, Aug. 1989, pp. 1426–1443 (copy not available).

Haisha, J, SOI Technologies: Their Past, Present and Future; Journal de Physique, Colloque C4, Supplemental au No. 9, Tome 49, Sep. 1988. (copy not available).

* cited by examiner

US 7,071,073 B2

PROCESS FOR MANUFACTURING LOW-COST AND HIGH-QUALITY SOI SUBSTRATES

PRIORITY

This application claims the priority of European Patent Application No. 01830822.1 entitled PROCESS FOR MANUFACTURING LOW-COST AND HIGH-QUALITY SOI SUBSTRATES filed Dec. 28, 2001, which is incorporated by reference.

FIELD OF THE INVENTION

The present invention relates to a process for manufacturing low-cost and high-quality SOI substrates.

BACKGROUND OF THE INVENTION

As is known, according to a solution that is currently very widespread in the micro-electronics industry, the substrate of integrated devices is obtained from monocrystalline silicon wafers. In recent years, as an alternative to wafers of only silicon, composite wafers have been proposed, namely the so-called silicon-on-insulator (SOI) wafers, consisting of two silicon layers, one of which is thinner than the other, separated by a silicon dioxide layer (see, for example, the article "Silicon-on-Insulator Wafer Bonding-Wafer Thinning Technological Evaluations" by J. Hausman, G. A. Spierings, U. K. P. Bierman, and J. A. Pals, Japanese Journal of Applied Physics, Vol. 28, No. 8, August 1989, pp. 1426–1443).

Considerable attention has recently been directed to SOI wafers, since integrated circuits that have a substrate formed starting from such wafers afford considerable advantages as compared to the same circuits formed on traditional substrates of monocrystalline silicon alone.

A typical process for manufacturing SOI wafers is described in the above-mentioned article and is based upon bonding of two monocrystalline silicon wafers (wafer bonding process). The wafers obtained using the traditional wafer bonding method present excellent electrical characteristics but have decidedly high costs (approximately six times the cost of standard substrates).

Other methodologies, such as ZMR, SIMOX, etc., are described in the article "SOI Technologies: Their Past, Present and Future", by J. Haisha, Journal de Physique, Colloque C4, Supplement au n° 9, Tome 49, September 1988. ZMR techniques have, on the other hand, not yet reached an acceptable industrialization level and present some limitations. In fact, they do not enable monocrystalline silicon layers to be obtained on extensive oxide areas, present a high number of defects on account of the dislocations generated by the stresses induced by the buried oxide, or do not enable high voltages to be reached, for example, in the SIMOX technology, where the oxide thickness obtained by oxygen implantation is about 100–200 nm. Furthermore, SIMOX technology involves a relatively high number of defects, which may give rise to problems during the subsequent processes for integrating the components.

Other processes taught by the applicant (see, for example, European Patent applications EP-A-0 929 095 and EP-A-1 073 112) enable the fabrication of substrates which have costs that are compatible with those of standard substrates but which, however, may be simplified.

SUMMARY OF THE INVENTION

An embodiment of the present invention provides a fabrication process that involves low costs and enables high quality wafers to be obtained. For example, a process is provided for manufacturing SOI substrates.

BRIEF DESCRIPTION OF THE DRAWINGS

For a better understanding of the present invention, preferred embodiments thereof are now described, purely by way of non-limiting example, with reference to the attached drawings.

DESCRIPTION OF PREFERRED EMBODIMENTS

Figure 1:
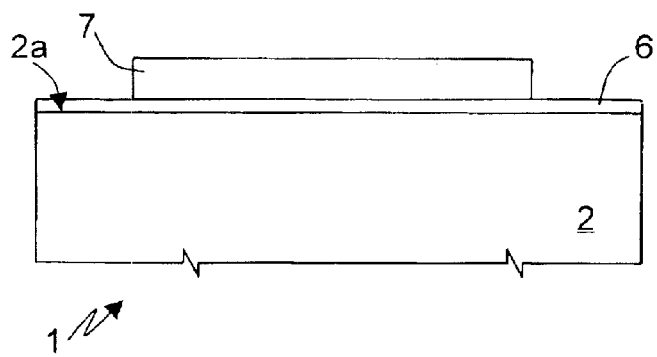
FIG. 1 is a cross-section of a monocrystalline silicon wafer, in an initial processing step, in accordance with an embodiment of the invention.
Figure 3:
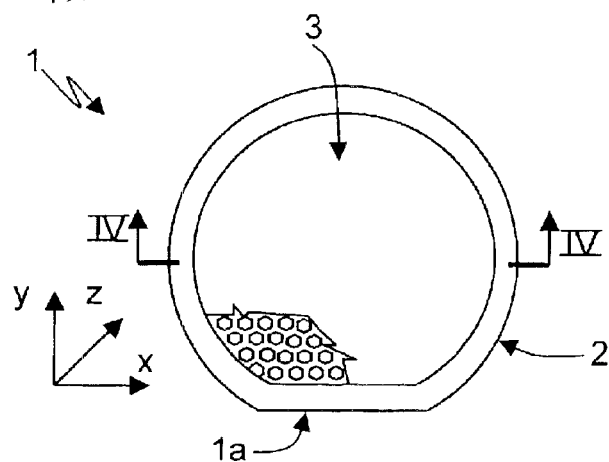
FIG. 3 is a top view of the wafer of FIG. 2 in a subsequent fabrication step, in accordance with an embodiment of the invention.

FIG. 1 shows a wafer 1 of semiconductor material, which, in the considered embodiment, is silicon, having a flat portion 1a (shown in FIG. 3 and parallel to the plane XZ) and being formed by a monocrystalline substrate 2, which has a top surface 2a. The surface 2a of the substrate 2 is coated with a nitride layer 6 (which overlies a pad oxide layer—not shown) and a resist layer 7. Next, the resist layer 7 is removed mechanically and selectively from an edge area of the wafer 1.

Figure 2:
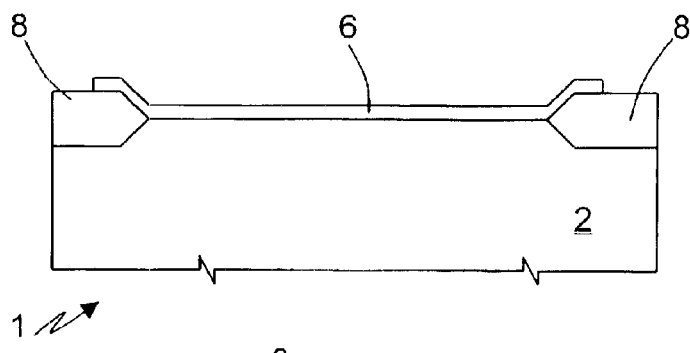
FIG. 2 is a cross-section of the wafer of FIG. 1 in a subsequent fabrication step, in accordance with an embodiment of the invention.

Next (FIG. 2), the nitride layer 6 is etched and removed wherever it is not covered by the resist layer 7, and a local oxidation is carried out, thus causing the growth of a field oxide region 8 along the edge of the wafer 1.

Figure 4:
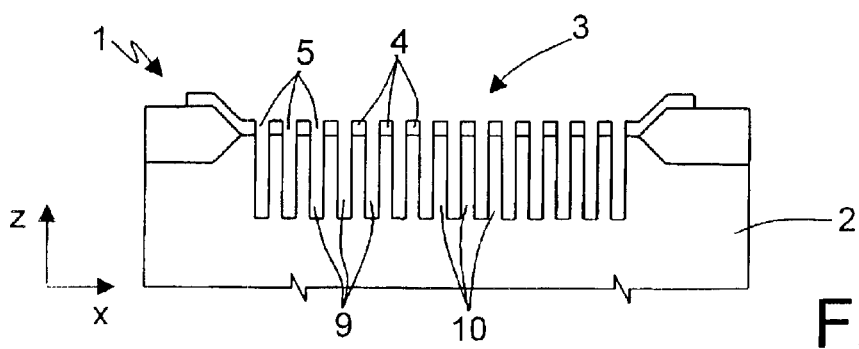
FIG. 4 is a cross-section of the wafer of FIG. 3, taken along line IV—IV, in accordance with an embodiment of the invention.

Then (FIGS. 3 and 4), using a resist mask (not shown) the nitride layer 6 is defined and forms a hard mask 3.

According to one aspect of the invention, the central area of the hard mask 3 (inside the area delimited by the field oxide region 8) defines a plurality of channels which traverse the entire surface of the hard mask 3. The channels may or may not intercept one another. Preferably, they define a mesh-like or reticular pattern, in which a mesh-like opening surrounds a plurality of areas that are not to be etched. Advantageously, as shown in detail in FIG. 3, the central area of the hard mask 3 defines a honeycomb pattern, with mask portions 4 which have a hexagonal shape in top view and are delimited by a labyrinthine opening 5.

Using the hard mask 3, the substrate 2 is etched to form a labyrinthine trench 9, the shape of which is identical to that of the labyrinthine opening 5 and which surrounds a plurality of monocrystalline silicon pillars 10 each having a hexagonal cross-section equal to that of the mask portions 4. For example, the pillars 10 may have a height of approximately 5 μm and a width (distance between parallel sides) of approximately 1 μm. The distance between the individual pillars 10 (width of the labyrinthine trench 9) may be approximately 1 μm.

Figure 5:
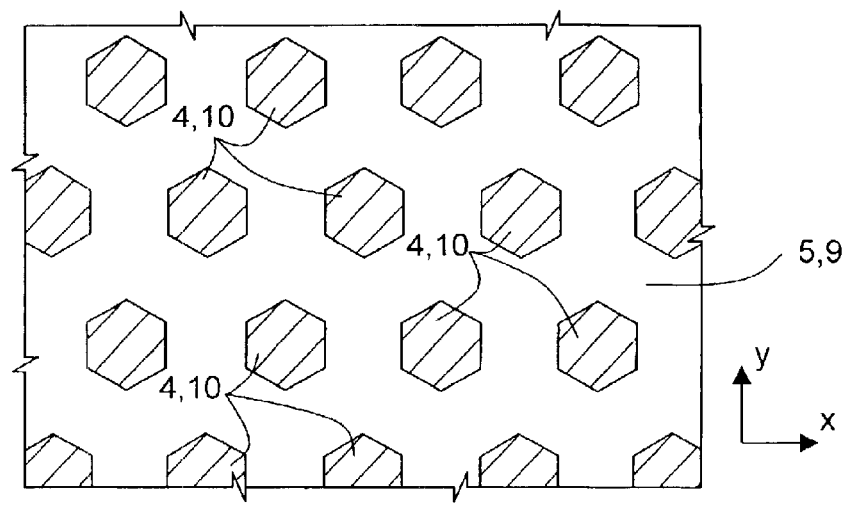
FIG. 5 shows an enlarged detail of FIG. 3, in accordance with an embodiment of the invention.

In the example illustrated, the hexagons formed by the mask portions 4 and by the pillars 10 have two sides perpendicular to the flat 1a of the wafer and parallel to the plane YZ (FIGS. 3 and 5), and the vertical axes of adjacent pillars 10 are aligned parallel to the flat 1a of the wafer and along two directions at ±60° with respect to the flat 1a.

After removal of the hard mask 3, the field oxide region 8 is removed, and an epitaxial growth is performed in a de-oxidizing environment (typically in an atmosphere with a high hydrogen concentration). Consequently (FIG. 6), an epitaxial layer 11 grows on top of the pillars 10 and closes at the top the labyrinthine trench 9. The epitaxial layer 11 is represented separately from the substrate 2 only in FIG. 6; in the subsequent figures, the reference number 2 designates the entire substrate, including the epitaxial layer. The thickness of the epitaxial layer 11 depends upon the electrical characteristics desired for the integrated circuit that is to be formed in the substrate 2.

Figure 6:
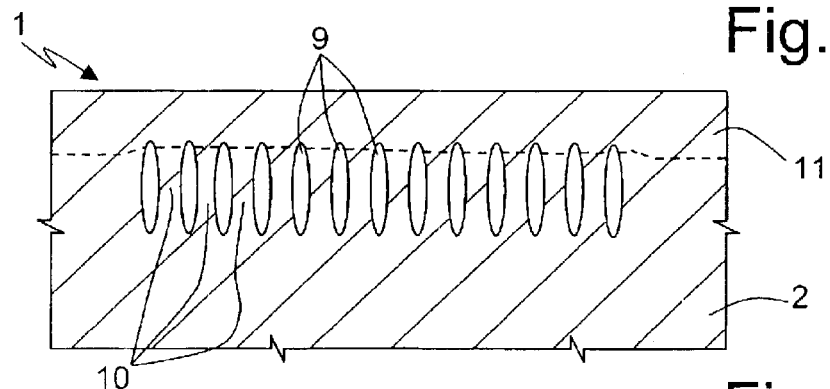
FIG. 6 is a cross-section similar to that of FIG. 4, in a subsequent fabrication step, in accordance with an embodiment of the invention.

As shown in FIG. 6, during the epitaxial growth there is a rounding off of the bottom edge and top edge of the labyrinthine trench 9, which is slightly reduced in size; in addition, inside the trench, hydrogen molecules ($H_2$) are entrapped.

Figure 7:
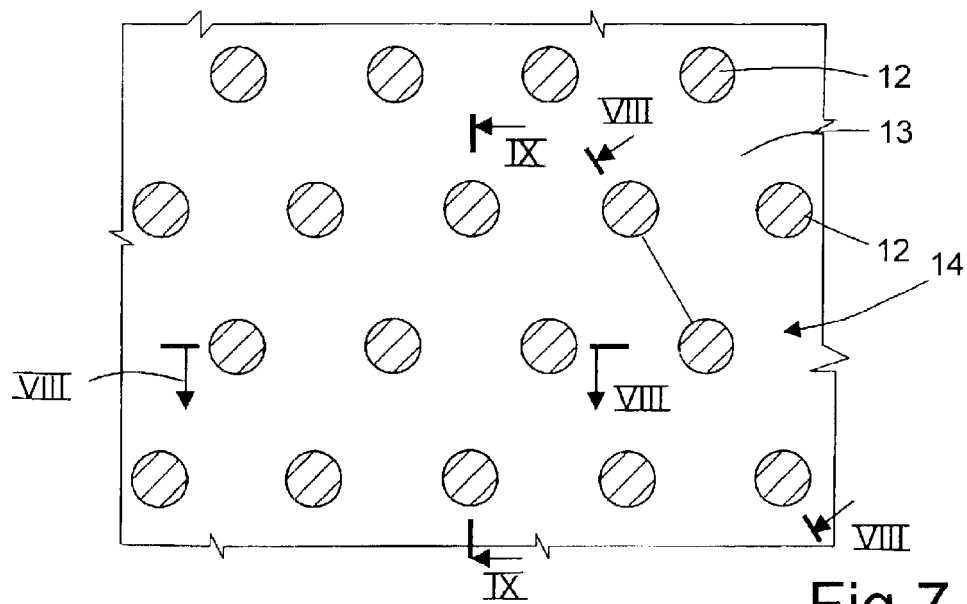
FIG. 7 shows a horizontal cross-section of the wafer, taken along line VII—VII of FIG. 8, in accordance with an embodiment of the invention.

Next, an annealing step is carried out according to an embodiment of the invention in an atmosphere comprising $N_2$ and substantially 5% $O_2$, at a temperature of substantially 1150° C. for substantially 5 hours. In the annealing step, the silicon atoms migrate so as to minimize the surface energy, as described in detail in the article "A New Substrate Engineering for the Formation of Empty Space in Silicon (ESS) Induced by Silicon Surface Migration" by T. Sato, N. Aoki, I. Mizushima, and Y. Tsunashima, IEDM 1999, pp. 517–520. In particular, the median part of each pillar 10 narrows, while the top and bottom portions widen out. In addition, the cross-section of the pillars changes from the hexagonal shape due to the etching of the labyrinthine trench 9 to a circular shape, as may be seen in the cross-section of FIG. 7, taken in a median horizontal plane. In this way, hourglass-shaped or handlebar-shaped pillars 12 are obtained (with vertical longitudinal axes) and are separated by a plurality of passages 13 forming a labyrinthine cavity 14. The passages 13 have a pseudospherical shape, with a smaller height and a greater width than the labyrinthine trench 9 prior to the annealing step, for example a height and a width of 1 μm.

Figure 8:
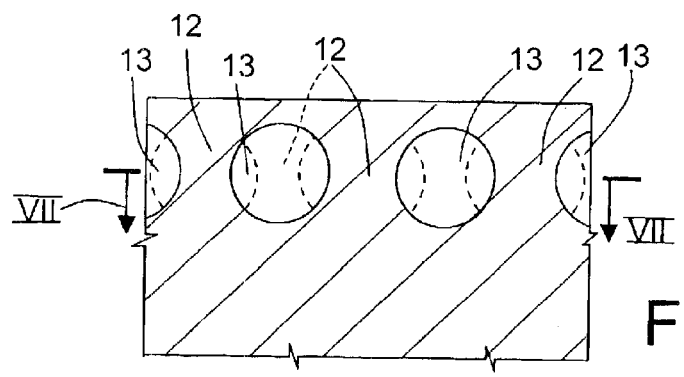
FIG. 8 is a cross-section of the wafer of FIG. 7, taken along line VIII—VIII, in accordance with an embodiment of the invention.
Figure 9:
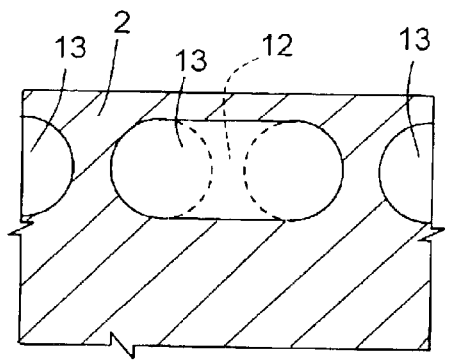
FIG. 9 shows a cross-section of the wafer of FIG. 7, taken along line IX—IX, in accordance with an embodiment of the invention.

In particular, the shape of the passages 13 is different according to the cross-section plane. In the example shown, with the alignment specified above of the pillars 12, by cutting the wafer 1 along planes passing through the axes of the pillars 12 and parallel to the aforesaid alignment directions of the pillars 10 (represented by the cross-sectional lines VIII—VIII of FIG. 7), the labyrinthine cavity 14 appears as formed by a plurality of passages 13 having an approximately circular shape, see FIG. 8, in which also the pillars that extend at the rear of the cross-section are illustrated and are represented with a dashed line. Instead, in a plane perpendicular to an alignment plane (along the cross-section line IX—IX of FIG. 7), the labyrinthine cavity 14 appears as formed by a plurality of horizontally elongated passages 13, in the background whereof pillars 12 are visible (FIG. 9).

Next, on the substrate 2 a resist layer 15 is deposited, a peripheral portion whereof is then removed both for enabling clamping of the wafer 1 and for enabling removal of a peripheral surface portion of the substrate 2 and thus gain access to the labyrinthine cavity 14.

Figure 10:
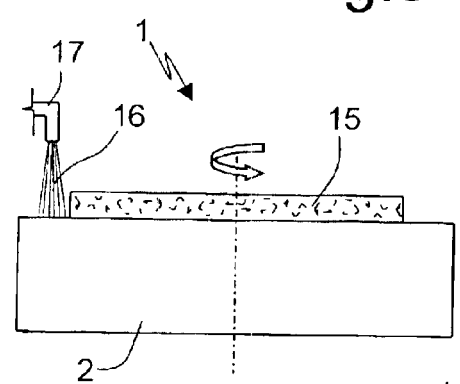
FIG. 10 is a side view of the wafer, in a subsequent fabrication step according to a first technique in accordance with an embodiment of the invention.
Figure 11:
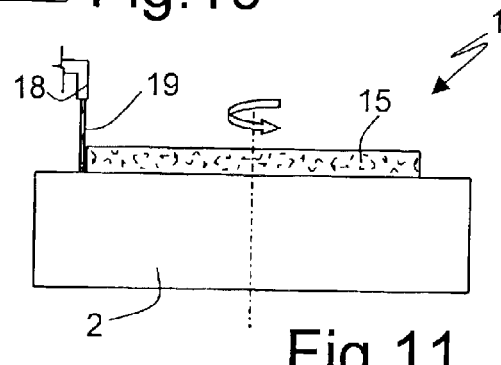
FIG. 11 is a side view similar to that of FIG. 10, in which a different technique is used in accordance with an embodiment of the invention.

Removal of the peripheral portion of the resist layer 15 may be performed according to different known techniques, using standard machines. According to a first solution (FIG. 10), solvent 16 may be sprayed on the edge of the wafer—by causing the wafer 1 to rotate with respect to a spraying nozzle 17, or else by displacing the spraying nozzle 17 along the edge of the wafer 1. According to a second solution (FIG. 11), the edge of the resist layer 15 is exposed using an optical fiber 18 which emits UV rays 19. Next, during development of the resist, the peripheral portion of the resist layer 15 is removed.

Figure 12:
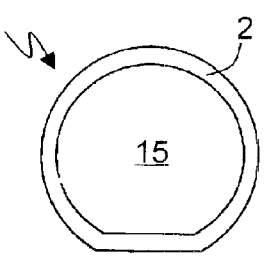
FIG. 12 is a top view of the wafer, at the end of the step of FIG. 10, in accordance with an embodiment of the invention.
Figure 13:
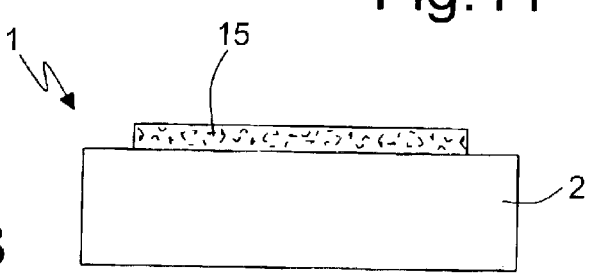
FIG. 13 is a side view of the wafer of FIG. 12, in accordance with an embodiment of the invention.
Figure 14:
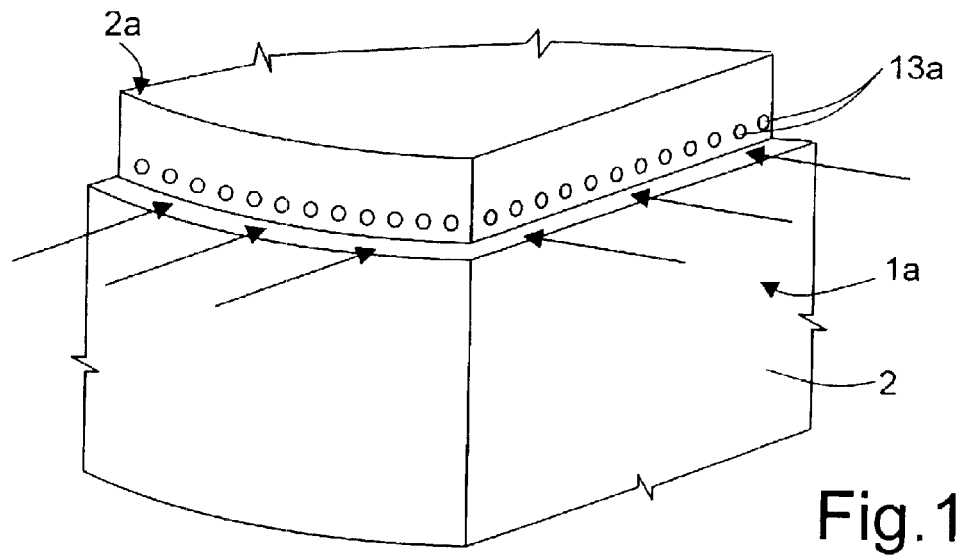
FIG. 14 shows a portion of the wafer of FIG. 13 during a subsequent fabrication step, in accordance with an embodiment of the invention.

In either case, at the end, a resist layer 15 extends on top of the substrate 2 and does not cover the peripheral portion of the substrate 2 (FIGS. 12 and 13). Next, using the resist layer 15 and performing an etch, a peripheral surface portion of the substrate 2 is removed, at least until the labyrinthine cavity 14 is reached, which thus becomes accessible laterally through side openings 13a that end on a cylindrical surface transverse to the surface 2a of the wafer 1, as shown in FIG. 14. Consequently, the hydrogen contained inside the labyrinthine cavity 14 is discharged, thereby the structure thus obtained has a good stability during the subsequent steps of formation of the integrated components.

Next, as indicated by the arrows in FIG. 14, after the resist layer 15 has been removed, an oxidizing means, such as $O_2$ or water vapor, is injected inside the labyrinthine cavity 14. The oxidizing means, coming into contact with the silicon of the pillars 12, causes complete oxidation thereof. During this step, preferably the wafer 1 is coated, both on the front and on the rear, by an oxide and nitride layer in order to prevent any possible surface oxidation of the wafer 1 from impoverishing the oxidizing means.

Figure 15:
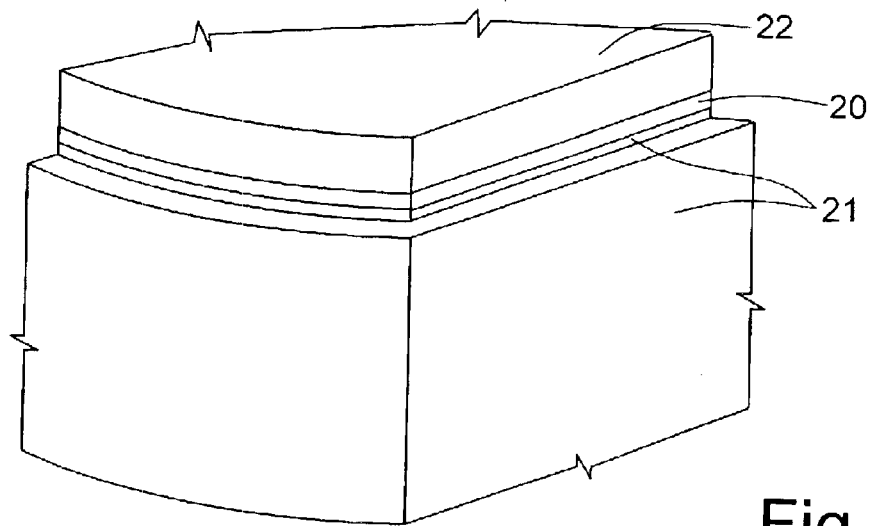
FIG. 15 shows a portion of FIG. 14 at the end of the process, in accordance with an embodiment of the invention.

An oxide layer 20 is thus formed inside and closes the labyrinthine cavity 14, as shown in FIG. 15. In practice, the area of the substrate 2 near the labyrinthine cavity 14 is oxidized along a lateral direction from the edge of the wafer. Any residual openings on the edge of the wafer 1 can be closed using TEOS or oxidized polycrystalline silicon.

At the end, the wafer 1 includes a first monocrystalline silicon region 21 obtained from the substrate 2, an insulating layer 20, of silicon dioxide, arranged on top of the first region 21, and a second region 22, arranged on top of the insulating layer 20 and formed in the epitaxial layer 11 of FIG. 6.

With the above solution, access to the labyrinthine cavity 14 can be gained without the use of masks, and hence at reduced costs.

Figure 16:
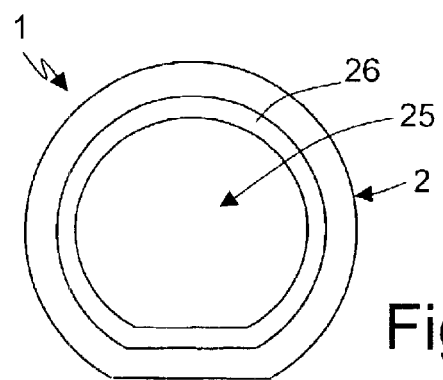
FIG. 16 is a top view of the wafer, similar to the view of FIG. 12, after peripheral removal, according to a variant of the embodiment of FIGS. 10–13.

FIG. 16 shows a different way for removing the superficial peripheral portion of the substrate 2. In particular, after the labyrinthine cavity 14 described above with reference to FIGS. 7–9 has been formed, a mask 25 is formed on top of the substrate 2 and has an opening 26 that follows the shape of the edge of the wafer 1 and extends at a short distance from said edge. Using the mask 25, a peripheral trench (not illustrated and having a shape identical to that of the opening 26) is made in the substrate 2 until the labyrinthine cavity 14 (not shown) is reached, which can thus be oxidized from the sides in the way described previously.

Figure 17:
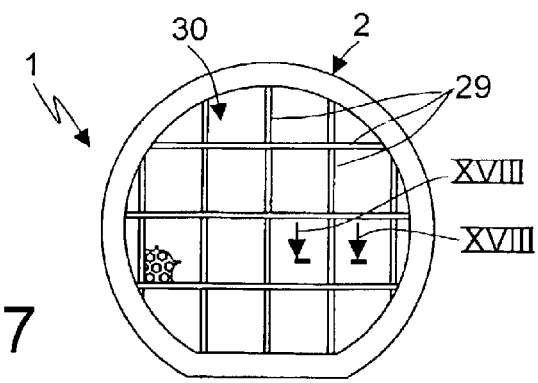
FIG. 17 is a top view of the wafer, similar to the view of FIG. 3, according to a different embodiment of the invention.
Figure 18:
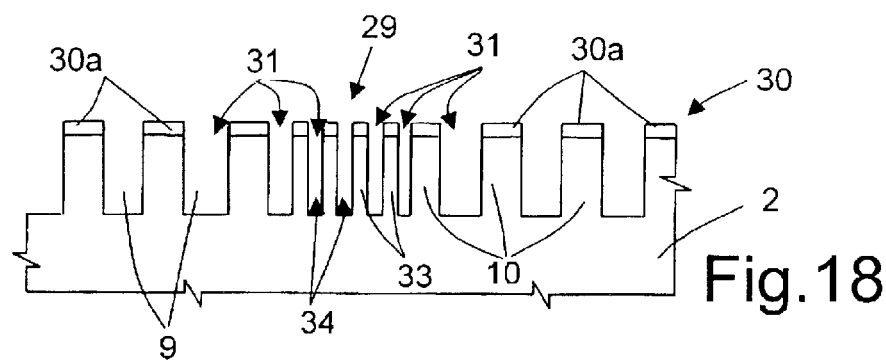
FIG. 18 is a cross-section of FIG. 17, taken along the cross-sectional line XVIII—XVIII, in accordance with an embodiment of the invention.
Figure 19:
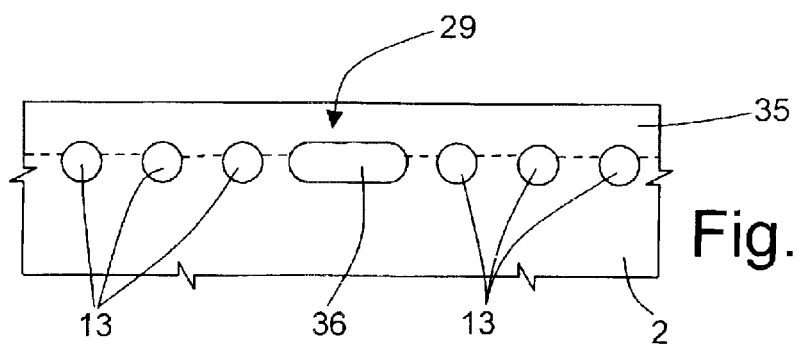
FIG. 19 is a cross-sectional view similar to that of FIG. 18, in a subsequent fabrication step, in accordance with an embodiment of the invention.

To improve accessibility to the labyrinthine cavity 14 and thus ensure good inflow of the oxidizing means to the pillars 12 also at the center of the wafer 1, it is possible to form channels of a greater width than that of the labyrinthine cavity 14 at the scribing lines of the wafer 1, as described hereinafter with reference to FIGS. 17–19.

According to this embodiment (FIG. 17), on top of the substrate 2 a resist mask 30 is formed which, at the scribing lines 29, has a smaller pitch. As shown in FIG. 18, the mask 30 is formed by mask portions 30a which are separated by a labyrinthine opening 31 and have a hexagonal shape. At the scribing lines 29, the mask portions 30a may still have a hexagonal shape (as was shown in FIG. 5), but a smaller area as compared to the mask portions 30a formed in the intermediate areas, which are delimited by the scribing lines 29. At the scribing lines 29, the labyrinthine opening 31 may also be narrower. For example, in this area the mask portions 30a may have a width of 0.5 μm, and the labyrinthine opening 31 may have a width of 0.5 μm.

The above geometry is then reproduced in the substrate 2, after trench etching, thereby, at the scribing lines 29, thin pillars 33 are formed having a smaller area than the pillars 10 at intermediate areas. In addition, the thin pillars 33 are separated by branches 34 of the labyrinthine trench 9 that are closer to one another as compared to the intermediate areas, as may be seen in the cross-section of FIG. 18.

As for the previous embodiment, after removing the mask 30 and the field oxide region 8, the epitaxial layer 11 is grown and an annealing step is performed. During this step, as shown in FIG. 19, on account of the short distance between adjacent branches 34 of the labyrinthine trench 9 at the scribing lines 29, the silicon of the thin pillars 33 migrates, and the thin pillars disappear. Consequently, in this area the branches 34 of the labyrinthine trench 9 join one another and form wide cavities 36. The cavities 36 extend along mutually perpendicular lines, according to the pattern of the scribing lines 29, which may be seen in the top view of FIG. 17, thus ensuring a wide cross section for passage of the oxidizing means in the subsequent oxidation step.

Figure 20:
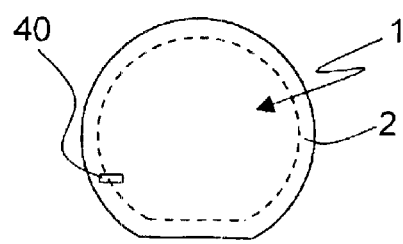
FIG. 20 is a top view of the wafer of FIG. 6, in a subsequent fabrication step, according to a different embodiment of the invention.

FIG. 20 shows a variant based upon the use of laser markers of the type normally employed for traceability of the wafer 1.

In detail, at the end of the annealing step, after the labyrinthine cavity 14 (and possibly the cavities 36) has been formed, holes 40 are made, using a laser. Preferably, as shown in the top view of FIG. 20, the holes 20 are formed in an area extending on part at the edge area of the wafer 1 and on part at the central area, in which the labyrinthine cavity 14 is present. In any case, the holes 40 must intercept, at least in some points, the labyrinthine cavity 14. Thereby, the hydrogen entrapped inside the labyrinthine cavity 14 can be discharged, as described previously with reference to the embodiment of FIG. 16, but without having to use a special mask in order to obtain stability of the labyrinthine cavity 14. The process then proceeds in the way described above with reference to FIGS. 14 and 15, namely with the oxidation of the labyrinthine cavity 14.

The advantages of the process described herein are illustrated hereinafter. First, the process used for manufacturing the SOI wafer is completely independent of the process for integration of the components in the wafer. In addition, the SOI substrate involves low fabrication costs, thanks to the formation of a buried labyrinthine cavity and to oxidation of the cavity from the sides. Furthermore, the SOI substrate thus obtained typically has a low number of defects level, and the thickness of the monocrystalline silicon regions may be chosen as desired, according to the particular application.

Finally, it is clear that numerous modifications and variations may be made to the process described and illustrated herein, all falling within the scope of the invention, as defined in the attached claims. For example, the shape of the labyrinthine trench 9, and thus of the labyrinthine cavity 14, may vary, and in general may form a more or less regular mesh or grid which surrounds pillars 10, 12 that may have any shape whatsoever, for example a square, rectangular or circular shape.

In addition, the labyrinthine trench 9, and thus the labyrinthine cavity 14, may be made up of two or more disconnected portions, provided that they can all be reached through the side openings 13a. Alternatively, the passages 13 can be arranged even along lines that do not intersect each other, provided that they end near the edge of the wafer 1, so as to enable access of the oxidizing means to the pillars 12 also at the center of the wafer. In this case, the pillars will have the shape of strips.

In addition, the step of forming the field oxide region 8 may be absent, and any other technique can be used for removing the resist layer from the edge of the wafer, in order to enable simple and convenient clamping of the wafer 1 during the initial processing steps.

What is claimed is:

1. A process for manufacturing a SOI substrate comprising the steps of:

separating two portions of a semiconductor material with at least one passage;

forming, after the separating step, at least one opening to the at least one passage through a side of the semiconductor material, the side formed by the two portions of the semiconductor material; and converting a region of the semiconductor material into an insulating material via the at least one opening and the at least one passage.

2. The process of claim 1, wherein the separating step includes the further step of forming a plurality of passages, the passageways being formed such that at least one passageway intersects with at least one other passageway and a plurality of pillars are formed separating the two planar regions.

3. The process of claim 2, wherein at least one of the plurality of pillars assumes a shape narrower in the middle than at the ends.

4. The process of claim 1, including the further step of annealing the semiconductor material.

5. The process of claim 1, wherein the forming step further includes the step of removing a surface portion of the semiconductor material until at least one passage is reached.

6. The process of claim 5, wherein the removing step further includes using a laser.

7. The process according to claim 1, wherein the converting step further includes the step of sufficiently oxidizing at least one passage via the at least one opening to form an insulating layer that separates the semiconductor portions.

8. A process for manufacturing a SOI substrate comprising the steps of:
    separating two portions of a semiconductor material with at least one passage;
    forming, after the separating step, at least one opening through the semiconductor material to the at feast one passage;
    converting a region of the semiconductor material into an insulating material via the at least one opening and the at least one passage; and
    wherein the separating step includes the further steps of,
    selectively removing portions of a substrate of the semiconductor material to form at least one trench opening on a top surface of the semiconductor material, and
    growing a layer of semiconductor material over the top surface to close the at least one trench and form the at least one passage.

9. The process of claim 8, wherein the selectively removing step comprises etching the top surface of the substrate. least one passageway intersects with at least one other passageway and a plurality of pillars are formed separating the two planar regions.

10. A process for manufacturing a SOI substrate comprising the steps of:
    separating two portions of a semiconductor material with at least one passage;
    forming, after the separating step, at least one opening through the semiconductor material to the at least one passage;
    converting a region of the semiconductor material into an insulating material via the at least one opening and the at least one passage; and
    wherein the separating step includes the further steps of,
    forming a first plurality of passages generally having a first width and defining a first group of regions, and
    forming a second plurality of passages having a second width smaller than said first width and defining a second group of regions.

11. The process according to claim 10, wherein the separating step further includes the steps of:
    growing a top layer; and
    annealing the semiconductor material sufficiently to cause joining of the second plurality of passages to form at least one buried channel having a larger cross-sectional area than a passage of the first plurality of passages.

12. The process according to claim 10, wherein the converting step further includes the step of sufficiently oxidizing at least one passage via the at least one opening to form an insulating layer.

13. A process for manufacturing SOI substrates, comprising the steps of:
    providing a wafer of semiconductor material;
    forming, inside said wafer, a plurality of fully enclosed passages laterally delimiting a plurality of semiconductor material regions;
    forming side inlet openings to the plurality of passages; and
    oxidizing said semiconductor material regions to form a buried insulating layer;
    wherein said oxidation step comprises feeding an oxidizing means through said side inlet openings.

14. The process according to claim 13, wherein said wafer has a monocrystalline structure.

15. The process according to claim 13, wherein said wafer has one larger surface, and said side inlet openings extend on a surface transverse to said larger surface.

16. The process according to claim 13, wherein said step of forming side inlet openings comprises removing a surface portion of said wafer until said plurality of passages is reached.

17. The process according to claim 16, wherein said step of removing a surface portion comprises removing a peripheral portion of said wafer.

18. The process according to claim 16, wherein said step of removing a surface portion comprises coating said wafer with a masking layer, feeding a solvent to a preset portion of said masking layer, and etching said wafer wherever it is not coated by said masking layer.

19. The process according to claim 16, wherein said step of removing a surface portion comprises coating said wafer with a masking layer; irradiating a preset portion of said masking layer with UV rays; removing said preset portion of said masking layer; and etching said wafer wherever it is not coated by said masking layer.

20. The process according to claim 13, comprising, after feeding an oxidizing means, closing said side inlet openings with insulating material.

21. A process for manufacturing SOI substrates, comprising the steps of:
    providing a wafer of semiconductor material;
    forming, inside said wafer, a plurality of passages laterally delimiting a plurality of semiconductor material regions;
    forming side inlet openings to the plurality of passages; and
    oxidizing said semiconductor material regions to form a buried insulating layer,
    wherein said oxidation step comprises feeding an oxidizing means through said side inlet openings;
    wherein said step of forming a plurality of passages comprises,
    before forming said side inlet openings, selectively removing portions of a substrate of semiconductor material to form a plurality of trenches, and
    growing a top layer of said semiconductor material on top of said substrate.

22. The process according to claim 21, wherein said step of selectively removing comprises etching said substrate starting from a top surface thereof.

23. The process according to claim 21, wherein said step of forming passages comprises, after growing a top layer, annealing of said wafer.

24. The process according to claim 23, wherein said step of annealing is carried out in an atmosphere comprising nitrogen and oxygen.

25. The process according to claim 23, wherein said step of annealing is carried out at a temperature of between 1100° C. and 1200° C.

26. The process according to claim 23, wherein said passages form a reticular cavity.

27. The process according to claim 26, wherein said semiconductor material regions form pillars having a hexagonal cross section and arranged in honeycomb fashion.

28. The process according to claim 27, wherein, during said step of annealing, said pillars are deformed and assume a handlebar-like shape, with a minimum cross section in a cross-sectional plane approximately halfway up.

29. process according to claim 21, comprising, before selectively removing portions of a substrate, selectively eliminating a peripheral portion of said substrate.

30. The process according to claim 29, wherein said step of selectively eliminating a peripheral portion of said substrate comprises selectively growing a peripheral oxide region, and in that said peripheral oxide region is removed before said step of growing a top layer.

31. A process for manufacturing SOI substrates, comprising the steps of:

providing a wafer of semiconductor material;

forming, inside said wafer, a plurality of fully enclosed passages laterally delimiting a plurality of semiconductor material regions;

forming side inlet openings to the plurality of passages; and oxidizing said semiconductor material regions to form a buried insulating layer, wherein said oxidation step comprises feeding an oxidizing means through said side inlet openings;

wherein said step of forming a plurality of passages comprises the steps of, forming a first plurality of passages delimiting a first group of said semiconductor material regions having a first width, and forming a second plurality of passages delimiting a second plurality of said semiconductor material regions having a second width smaller than said first width, said second plurality of passages extending along scribing lines of said wafer.

32. The process according to claim 31, wherein said step of forming a plurality of passages comprises, after growing a top layer, annealing said wafer, causing joining of said second plurality of passages during said annealing step; and forming buried channels having a larger width than said plurality of passages.

33. The process according to claim 32, wherein said step of selectively forming a peripheral oxide region comprises locally growing said peripheral oxide region by protected local oxidation.

34. A process for manufacturing a SOI substrate comprising the steps of:

separating two portions of a semiconductor material with at least one cavity;

forming, after the separating step, at least one opening to the at least one cavity through the semiconductor material; and converting a region of the semiconductor material into an insulating material via the at least one opening and the at least one cavity.

35. A process for manufacturing a SOI substrate comprising the steps of:

separating two portions of a semiconductor material with at least one cavity;

forming, after the separating step, at least one opening to the at least one cavity through a side of the semiconductor material, the side formed by the two portions of the semiconductor material; and converting a region of the semiconductor material into an insulating material via the at least one opening and the at least one cavity.

* * * * *

UNITED STATES PATENT AND TRADEMARK OFFICE
CERTIFICATE OF CORRECTION

PATENT NO. : 7,071,073 B2
APPLICATION NO. : 10/331189
DATED : July 4, 2006
INVENTOR(S) : Flavio Villa, Gabriele Barlocchi and Pietro Corona It is certified that error appears in the above-identified patent and that said Letters Patent is hereby corrected as shown below:

Column 7 line 21 change the word "feast" to --least--

Signed and Sealed this

Third Day of October, 2006

JON W. DUDAS
*Director of the United States Patent and Trademark Office*